United States Patent
Denholm et al.

[19]

[11] Patent Number: 6,101,971
[45] Date of Patent: Aug. 15, 2000

[54] ION IMPLANTATION CONTROL USING CHARGE COLLECTION, OPTICAL EMISSION SPECTROSCOPY AND MASS ANALYSIS

[75] Inventors: A. Stuart Denholm, Lincoln; Jiong Cheng, Beverly; Michael A. Graf, Cambridge; Peter Kellerman, Essex, all of Mass.; George Stejic, Franklin, Wis.

[73] Assignee: Axcelis Technologies, Inc., Cleveland, Ohio

[21] Appl. No.: 09/218,770

[22] Filed: Dec. 22, 1998

Related U.S. Application Data

[63] Continuation-in-part of application No. 09/078,129, May 13, 1998.

[51] Int. Cl.[7] .................................................. C23C 16/00
[52] U.S. Cl. ................ 118/723 E; 118/715; 118/723 R; 216/60; 427/7
[58] Field of Search .............................. 118/723 E, 715, 118/723 ER; 156/345; 216/60; 438/7

[56] References Cited

U.S. PATENT DOCUMENTS

| | | |
|---|---|---|
| 4,539,217 | 9/1985 | Farley . |
| 4,587,433 | 5/1986 | Farley . |
| 4,764,394 | 8/1988 | Conrad . |
| 5,475,618 | 12/1995 | Le .......................................... 364/550 |
| 5,654,043 | 8/1997 | Shao et al. . |
| 5,658,423 | 8/1997 | Angell et al. . |
| 5,711,843 | 1/1998 | Jahns ..................................... 156/345 |

OTHER PUBLICATIONS

D. M. Jamba, "Dosimetry Measurement In Ion Implanters", Nuclear Instruments and Methods 189 pp. 253–263, North–Holland Publishing Company (1981).

C.M. McKenna, "High Current Dosimetry Techniques" Radiation Effects, vol. 44, pp. 93–110, (1979).

D. M. Jamba, Semiconductor Measurement Technology: Some Aspects of Dose Measurement For Accurate Ion Implantation, NBS Special Publication 400–39, pp. 1–36 (Issued Jul. 1977).

D. M. Jamba, "Secondary Particle Collection In Ion Implantation Dose Measurement" Rev. Sci. Instrum., vol. 49, No. 5, pp. 634–638 (May 1978).

E.P. EerNisse, G.D. Peterson, and D.G. Schueler "Ion Beam Profile Monitor" Rev. Sci. Instrum., vol. 46, No. 3, pp. 266–268 (Mar. 1975).

*Primary Examiner*—Shrive Beck
*Assistant Examiner*—P. Hassanzadeh
*Attorney, Agent, or Firm*—Watts, Hoffmann, Fisher & Heinke, Co., L.P.A.

[57] ABSTRACT

Apparatus and method for implanting ions into a workpiece surface. A concentration of ions is produced. An optical analysis of the concentration of ions is performed and recorded. The constituency of the ion concentration is determined by comparing the optical analysis data with a database of records on a storage medium wherein the optical analysis data for given concentrations of ions have been stored for subsequent access. Ions from the ion concentration are caused to impact a workpiece surface. The dose of ions implanted into the workpiece is measured. Implantation of the workpiece is stopped once an appropriate dose has been reached.

7 Claims, 6 Drawing Sheets

6,101,971

ION IMPLANTATION CONTROL USING CHARGE COLLECTION, OPTICAL EMISSION SPECTROSCOPY AND MASS ANALYSIS

CROSS REFERENCE TO RELATED APPLICATIONS

The present application is a continuation-in-part of U.S. application Ser. No. 09/078,129 filed May 13, 1998 entitled Ion Implantation Control Using Optical Emission Spectroscopy.

FIELD OF THE INVENTION

The present invention concerns a workpiece treatment system that uses charged ions for treating a workpiece. One such system immerses one or more silicon wafers in an ion plasma having a high density of positively charged ions that are then accelerated against the surface of the wafers to implant a controlled concentration of the ions into the wafers. A second such system includes an ion source and structure for moving ions from the source to an implant station where target workpieces are situated.

BACKGROUND ART

Commercially available ion implantation systems employ an ion source that includes a source chamber spaced from an ion implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions which strike the wafers to penetrate those wafers in the implantation chamber. In a typical application of such a system the wafers are silicon wafers and the ions are used to "dope" the wafers to create a semiconductor material. Selective implantation with the use of masks and passivation layers allows an integrated circuit to be fabricated.

U.S. Pat. No. 4,764,394 to Conrad entitled "Method and Apparatus for Plasma Source Ion Implantation" discloses an ion implantation system for treating a target by means of ionic bombardment. Ion implantation into surfaces of a three dimensional target is achieved by forming an ionized plasma about the target within an enclosing chamber. Once the plasma is set up in a region surrounding the target, ions from the plasma are driven into the target object from all sides without need to manipulate the target. This implantation is accomplished by application of repetitive pulses of high voltage, typically 20 kilovolts or higher, that cause the ions to be driven into the exposed surfaces of the target. A technique discussed in the '394 patent for setting up the plasma is to introduce a neutral gas into the region of the target and then ionize the gas with ionizing radiation.

The system disclosed in the '394 patent to Conrad uses an ion source to create an ion plasma in a region surrounding a workpiece and then selectively pulses an electrode that supports the workpiece thereby attracting the positive ions in the plasma toward the workpiece.

U.S. Pat. No. 5,654,043 to Shao et al also concerns a system for treating a workpiece surface by causing ions to impact the workpiece surface. A gas is injected into an implantation chamber so that an ionizable gas occupies a region in close proximity to the workpiece surface. A plasma of implantation material is created within the interior region of the implantation chamber by repeatedly relatively biasing conductive electrodes with a sequence of pulses that both ionize the gas molecules injected into the chamber and accelerate the ionized gas molecules toward the implantation surfaces of the one or more workpieces. The disclosure of the '043 patent to Shao et al is incorporated herein by reference.

U.S. Pat. No. 5,658,423 to Angell et al concerns a method of monitoring the status of a plasma in a chamber while conducting an etch process. Spectral analysis data is collected during etching, with the spectral data characterizing an emission of light from an etch species contained in the plasma.

A paper entitled "Dosimetry Measurement in Ion Implanters" copyright 1981 by Douglas M. Jamba discloses the use of a dosimetry cup to collect charges impacting a target during ion beam implantation. To more accurately measure the charge actually impacting the target, a biasing electrode located between a beam defining aperture and the entrance to the cup is used to suppress electrons and negative ions that are trying to leave the cup. The biasing electrode also suppresses electrons generated on the defining aperture that are trying to enter the cup, and repels electrons that are carried with the ion beam.

A paper entitled "High Current Dosimetry Techniques" copyright 1979 by C. M. McKenna discloses use of one or more dosimetry cups located adjacent to the target for in-situ measurements of the charge bombarding the target during ion beam implantation. Measurements made by such dosimetry cups are used to control the ion beam being used for implantation. McKenna further discloses a negatively biased cup collector surface used in conjunction with less negatively biased cup walls to repel unwanted electrons from entering the cup. However, McKenna rejected the use of a negatively biased cup collector because experiments showed that this type of electrical biasing caused eruptions on the silicon target due to electrical discharges aggravated by secondary electrons trapped on the magnetic field lines within the dosimetry cup.

DISCLOSURE OF THE INVENTION

The present invention concerns an ion implantation control system that uses the results of an optical analysis of the ions present in plasma gas and the concentration of charges impacting the workpiece to control parameters of the implantation process. For example, the present invention may be used to suspend the ionization process once the desired level of doping is complete. The present invention may be used in ion beam implantation or plasma immersion ion implantation.

More specifically, the present invention may be used with an ion implantation system which causes ions to impact an implantation surface. The ion implantation system generally comprises a process chamber defining a chamber interior into which one or more workpieces can be inserted for ion treatment and an energy source for setting up an ion plasma. A workpiece support is located within the process chamber for positioning one or more workpieces for implantation.

One exemplary embodiment of the invention is used in calibrating an ion implantation process and includes the step of producing a concentration of ions in an ion source chamber and performing a mass analysis of the concentration of ions and recording mass analysis data. The process also includes the step of performing an optical analysis of the concentration of ions within the ion source chamber and recording the optical analysis data. A database of records based upon this data gathering is stored on a storage medium for a given concentration of ions in the ion source chamber.

Most typically, the ion plasma within the source chamber is created by injecting an ionizable gas into the source chamber. In this embodiment the steps of performing the mass analysis and performing the optical analysis are performed for different concentrations of the ionizable gas. One application for the invention is for use with a system where mass analysis of the constituents of the ion plasma is not possible but where optical analysis can be performed. In such a system the optical analysis data for the ion plasma can be gathered and is then used to adjust the operating parameter of the system based on a correlation with data stored in a database.

A somewhat different application of optical analysis data can be used without resort to a correlation to mass analysis data. By comparing optical analysis data taken at different intervals the constituent components of the ion plasma chamber are monitored.

One or more dosimetry cups are disposed around the implantation surface of the workpiece. The dosimetry cups are electrically biased and include a charged ion collecting surface parallel to the implantation surface. An optical sensor for monitoring the ion plasma provides optical data to a data store correlating optical analysis obtained from the optical sensor and dosimetry data collected from the one or more dosimetry cups with a parameter of the ion plasma. A computation means is used to combine the stored optical and dosimetry data and control a parameter of the ion implantation process.

The combination of optical sensor with dosimetry data increases the accuracy with which the ion implantation parameter may be controlled. For example, the dosimetry cups give real time information about the level of doping present on the workpiece being processed. Parameters of an implantation process can therefore be controlled based on the present condition of the workpiece instead of relying on past experience to preset the implantation parameters. For example, the voltage generated by the modulator may be adjusted or implantation suspended based on the ion dose present on the wafer being processed.

These and other objects, advantages and features of the invention are described in greater detail in conjunction with the accompanying drawings.

BRIEF DESCRIPTION OF THE DRAWINGS

FIG. 1a is an elevational view of a wafer support;

FIG. 1b is a top plan view of the wafer support depicted in FIG. 1a;

BEST MODE FOR PRACTICING THE INVENTION

Figure 1:
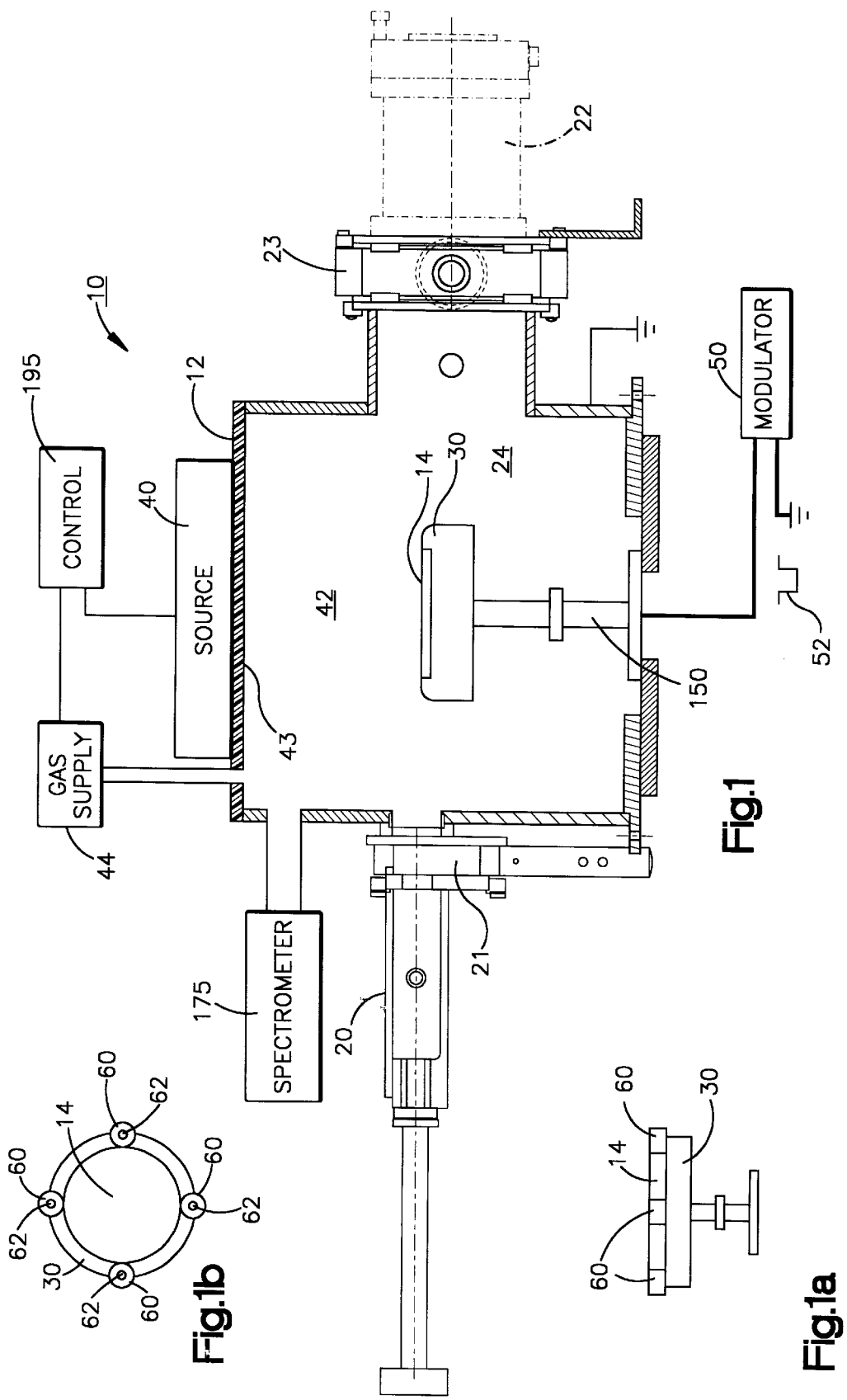
FIGS. 1 and 2 are schematic section and perspective views depicting an ion implantation system constructed in accordance with a preferred embodiment of the present invention.
Figure 2:
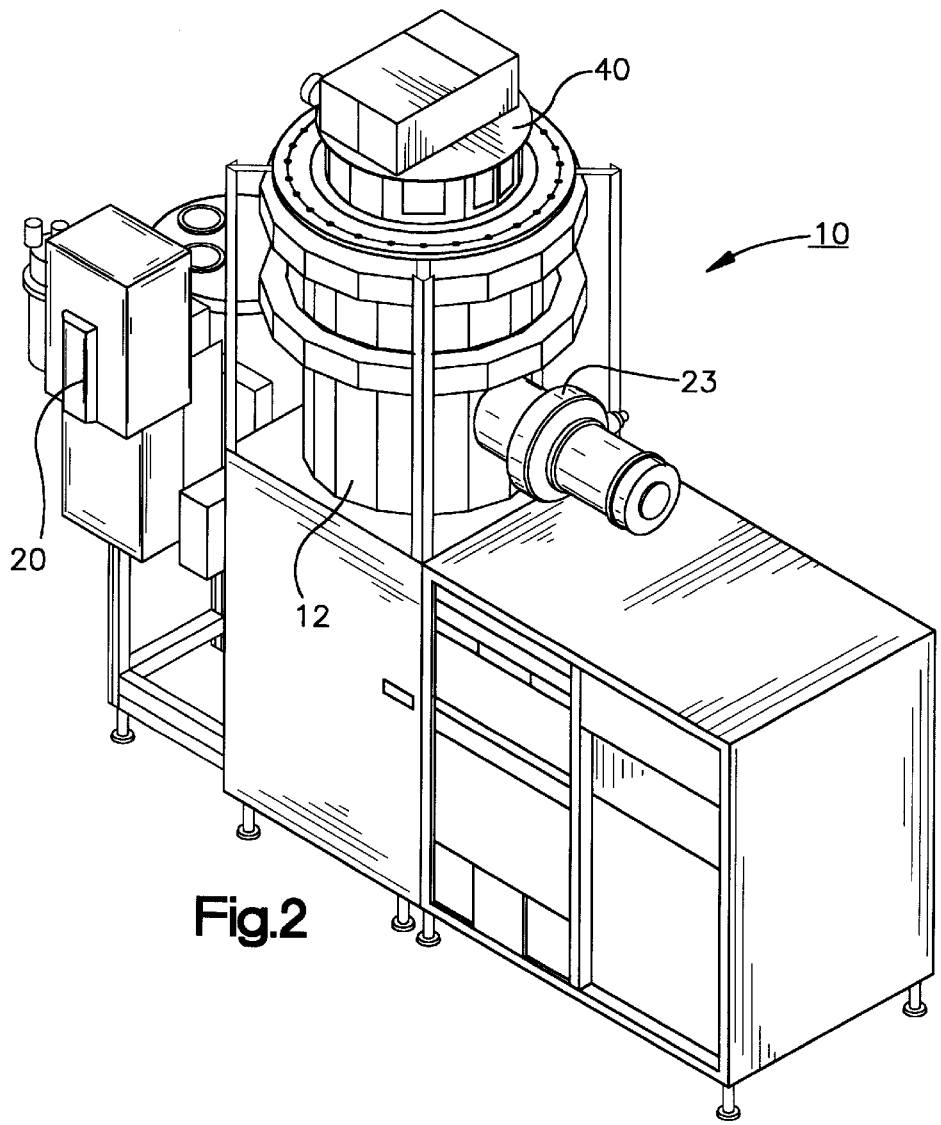

FIGS. 1 and 2 depict an ion implantation system 10 that includes a generally cylindrical plasma chamber 12 into which one or more generally planar workpieces 14 are inserted for ion treatment of those workpieces. The implantation system 10 includes a loadlock 20 for inserting workpieces into the plasma chamber 12. The loadlock 20 allows the plasma chamber 12 to be maintained at a reduced pressure (in relation to atmospheric pressure) as workpieces are moved into and withdrawn from the chamber 12 through a valve 21 that is opened and closed. A vacuum pump 22 maintains the chamber interior at a reduced pressure that is regulated by a valve 23 located between the chamber 12 and the pump 22.

The plasma chamber 12 depicted in FIG. 1 has inner walls that define a chamber interior 24 into which the workpieces 14 are inserted. The workpieces 14 are placed onto and removed from a generally planar conductive platen or support 30. The platen 30 may have any suitable dimensions depending on the size of the workpiece it must support.

An energy source 40 is located at one end of the generally cylindrical process chamber 12. The energy source 40 injects energy into the chamber 12 to produce an ion plasma inside the plasma chamber 12 in a region 42 between the energy source 40 and the wafer support 30. One example of a suitable energy source 40 is an rf coil operating at 13.5 Megahertz that transmits rf energy through a quartz plate 43 that bounds one end of the plasma chamber 12. Other coil energization frequencies are possible and , for example, could include frequencies of about 2.0 Megahertz. Rf energy entering the chamber 12 produces an ion plasma from gas molecules that are pumped into the plasma chamber from an external gas supply 44. Representative gas pressures in the chamber 12 are maintained in the range of 0.2 to 5.0 millitorr. As an example, Nitrogen gas can be routed into the chamber and ionized by rf energy entering the chamber from the rf coil. Application of this energy ionizes the gas molecules. Other techniques known for producing an ion plasma in the plasma chamber could be utilized while practicing the present invention.

Once the ion plasma is set up in the region 42 between the support 30 and the quartz plate 43, the ions are accelerated into contact with the workpiece 14. In a preferred embodiment of the present invention, the workpiece is a silicon wafer, generally round in shape, that is placed onto the support 30. The workpiece support 30 is constructed from an electrically conductive material. The ions are positively charged so that application of an electric field of suitable magnitude and direction in the region of the plasma will cause the ions in the plasma to accelerate toward and impact the surface of the silicon wafers. As seen in FIG. 1, a modulator 50 supplies voltage pulses 52 that relatively bias the conductive support 30 with respect to conductive inner walls of the chamber 12 to set up an appropriate electric field in the region 42.

Once the wafers 14 are treated, they are removed from the plasma chamber 12 and taken to other processing stations where the treated wafers are further fabricated to form integrated circuits. Such ion treatment has been conducted on eight inch diameter silicon wafers with good uniformity. Ion implantation using structure similar to that shown in FIG. 1 has also been used to treat large surfaces for the fabrication of flat panel displays.

Figure 6:
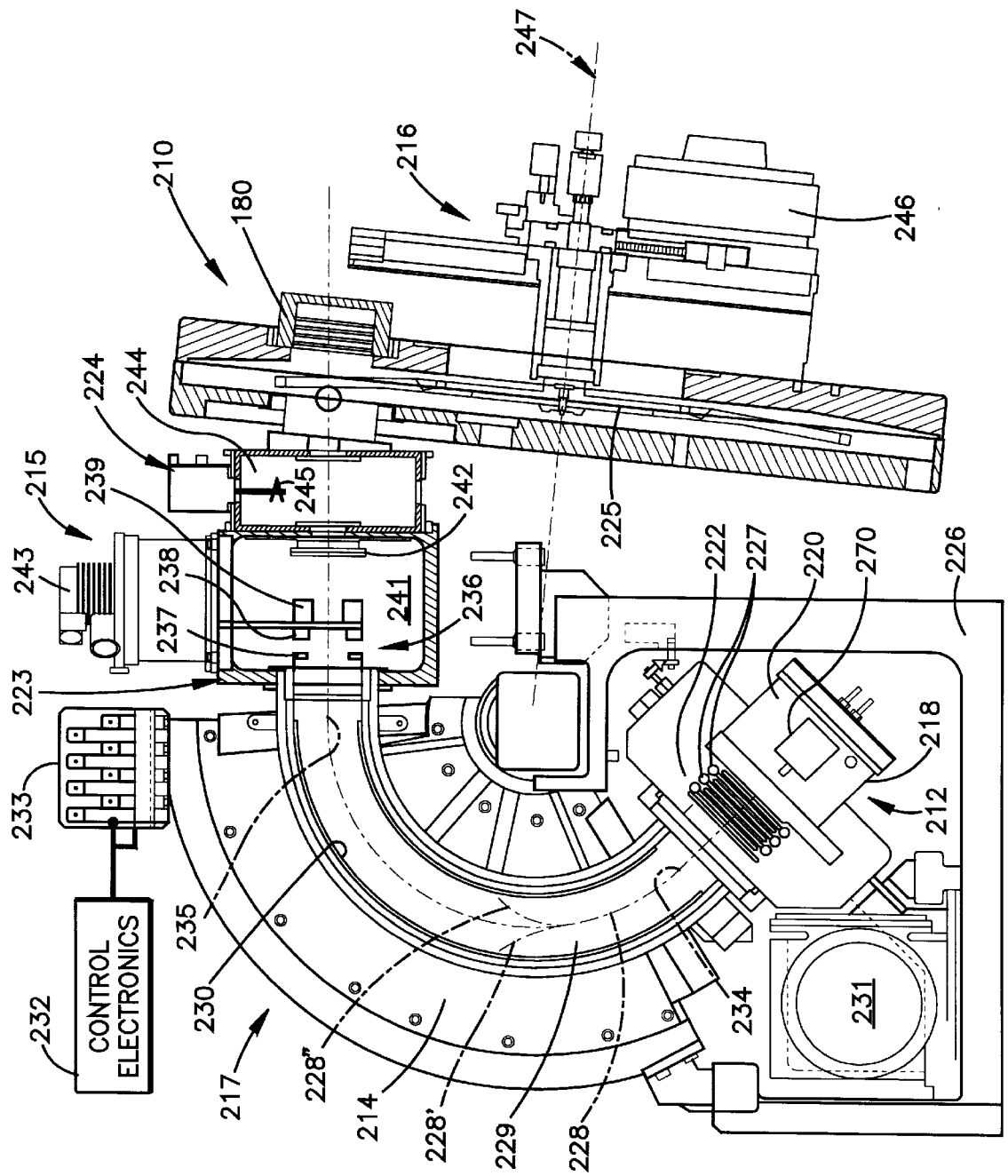
FIG. 6 is a schematic depiction of a low energy ion implanter.

FIG. 6 discloses a relatively low energy, high current ion implanter 210 wherein ions are extracted from a source to impact workpieces at a workstation. The ion implanter 210 includes an ion source 212, a mass analysis magnet 214, a beamline assembly and a target or end station 216. The ion source 212 and the mass analysis magnet 214, along with their respective power supplies, are supported within an implanter housing 217. The ion implanter 210 is a low energy implanter which operates with implant energies of a range 0.2–90 kev and supplies beam currents of about 10 milliamps. The beamline assembly 215 is relatively short due to the tendency of a low beam to expand (i.e. blow up) during propagation of the beam from the ion source 212 to the end station 216.

The ion source 212 comprises a housing 218 which defines a plasma chamber 220, and an ion extractor assembly 222. The beamline assembly 215 includes a resolver housing 223 and a beam neutralizer 224. The beam neutralizer 224 functions to retard beam blow-up. Downstream from the beam neutralizer 224 is the end station 216, which includes a disk-shaped wafer support 225 upon which wafers to be treated are mounted. The wafer support 225 resides in a target plane which is (generally) perpendicularly orientated to the direction of the implant beam.

The ion source 212 is mounted to an L-shaped frame 226. Ionizable dopant gas, which is obtained either directly in the form of a compressed gas or indirectly from a solid form which has been vaporized, is injected into the plasma chamber 220. Typical source elements are boron (B), phosphorous (P), galluim (Ga), Indium (In), antimony (Sb), and arsenic (As). Most of these source elements are provided in solid form, except boron, which is typically provided in the form of gaseous boron trifluoride or diborane.

Energy is transferred to the ionizable dopant gas to generate ions within the plasma chamber 220. Generally, positive ions are generated, although the present invention is applicable to systems wherein negative ions are generated by the source. The positive ions are extracted through a slit in the plasma chamber 220 by the ion extractor assembly 222 which comprises a plurality of electrodes 227. The electrodes are charged with negative potential voltages. Accordingly, the ion extractor assembly functions to extract a beam 228 of positive ions from the plasma chamber and accelerate the extracted ions into the mass analysis magnet 214 which is supported by the frame 226.

The mass analysis magnet 214 functions to pass only ions of an appropriate mass-to-charge ratio to the resolver housing 223. The mass analysis magnet 214 is required because the ion source 212, in addition to generating ions of appropriate mass-to-charge ratio, also generates ions of greater or lesser mass-to-charge ratio than that desired.

The mass analysis magnet 214 bounds a curved beam path 229 which is defined by an aluminum beam guide 230, evacuation of which is provided by a vacuum pump 231. The ion beam 228 which propagates along this path is affected by the magnetic field generated by the mass analysis magnet 214. The strength and orientation of this magnetic field is controlled by control electronics 232 which adjusts the electrical current through the field windings of the magnet 214 through magnet connector 233. Partial focusing of the ion beam by the magnet 214 is achieved in the "dispersive " plane (the plane of the curved beam path 229) only by establishing a gradient in the magnetic field (i.e. "Indexing"), or by rotating the entrance or exit poles of the magnet 214.

The magnetic field causes the ion beam 228 to move along the curved beam path 229, from a first or entrance trajectory 234 near the ion source 212 to a second or exit trajectory 235 near the resolving housing 223. Portions 228' and 228" of the beam 228 comprised of ions having an inappropriate mass-to-charge ratio are deflected away from the curved trajectory and into the walls of an aluminum beam guide 230. In this manner, the magnet 214 passes to the resolving housing 223 only those ions in the beam 228 which have the desired mass-to-charge ratio.

The entrance and exit trajectories 234, 235 of the ion beam 228, being in the plane of the curved beam path 229, lie in the dispersive plane. The 'non-dispersive' plane is defined herein as the plane which resides perpendicular to both the dispersive plane and the target plane. Accordingly, the magnet 214 performs mass analysis in the dispersive plane by removing from the beam ions of inappropriate mass-to-charge ratio, and redirecting the beam from the entrance trajectory 234 to the exit trajectory 235 and toward the target plane in which the wafer lies.

The resolving housing 223 contains an electrostatic lens 236, constructed according to the principles of the present invention, which mass resolves and focuses the ion beam 228 output by the magnet 214. The electrostatic lens 236 is constructed in a triple electrode (triode) configuration comprising a terminal electrode pair 237, a suppression electrode pair 238 and a ground or resolving electrode pair 239. The terminal electrode pair 237 is fixedly attached to the housing 217 and operates at the voltage thereof (positive in the acceleration mode, negative in the deceleration mode, and zero in the drift mode). Each of the suppression electrodes 238, like each of the pair of ground electrodes 238, is movable toward and away from each other to adjust the gap therebetween. The suppression electrode 237 operates at a negative potential and the resolving electrode 239 is at ground potential (zero volts).

The suppression and resolving electrode pairs 238, 239 are collectively referred to as the adjustable lens subassembly 240. The resolving housing 223 defines a chamber 241 in which resides the electrostatic lens 236, as well as a dosimetry indicator such as a Faraday flag 242. The chamber 241 is evacuated by a vacuum pump 243. The adjacent beam neutralizer 224 defines a second chamber 244 which includes an electron shower 245. The electron shower 245 neutralizes the positive charge which would otherwise accumulate on the target wafer as a result of being implanted by the positively charged ion beam 228.

The disc shaped wafer support 225 at the end station 216 is rotated by a motor 246. The ion beam strikes wafers mounted to the support as they move in a circular path. The end station 216 is pivotable along an axis 247 which is generally parallel to the path of the ion beam so that the target plane is adjustable about this axis. In this manner, the angle of ion implantation may be slightly modified from the normal.

Figure 4:
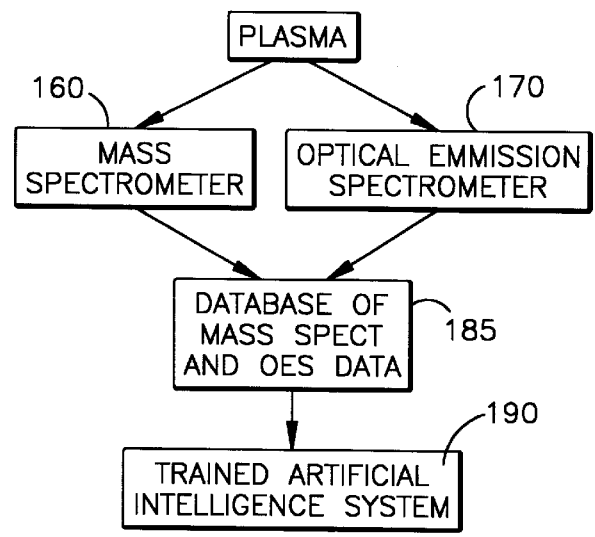
FIG. 4 is a flowchart of a process for calibrating the ion implantation system such as the system depicted in FIGS. 1 and 2.
Figure 5:
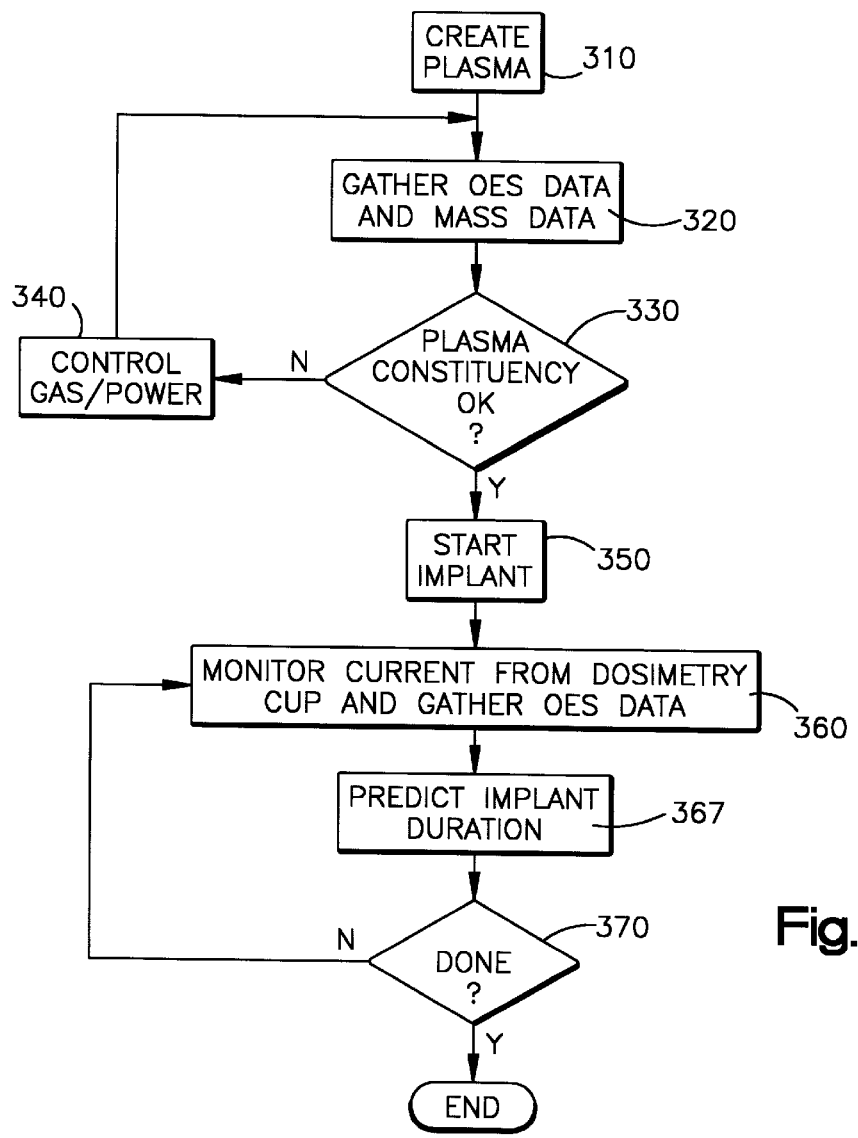
FIG. 5 is a flowchart of a process for controlling the ion implantation system such as the system depicted in FIGS. 1 and 2.

The present invention concerns a system for treating a workpiece surface that takes advantage of a database of information typically stored on a computer to improve the implantation process. The flow charts of FIGS. 4 and 5 depict the process steps performed during practice of the invention. The ion implanter 10 of FIGS. 1 and 2 and the source 212 depicted in FIG. 6 both include an evacuated region that confines an ion plasma. The flow chart of FIG. 4 depicts a process of data gathering by the system of FIG. 6. Two process steps 160, 170 are performed on a plasma. A first step is the step of performing a mass analysis 160 of the ions and recording the mass analysis data. This processing step is performed using control over the magnet 214 and its field output as well as a Faraday cup for monitoring beam intensity downstream from the magnet. The step of recording the mass analysis data is performed with the use of a programmable controller such as a general purpose computer. One presently preferred technique for performing the mass analysis is to use a computer to control the operation of the magnet 214 (FIG. 6) which causes the ions to bend along controlled arcs or paths to a Faraday cup detector 180 located behind the wafer support 225.

A second step of the process in the FIG. 4 depiction is to perform an optical analysis 170 of the ion plasma within the plasma chamber 212 and record this optical analysis data. The optical analysis 170 is performed by use of an optical spectrometer 270 that views the ion plasma inside the plasma chamber 218. These two data gathering steps 160, 170 yield two views of the same plasma. A database 185 of records is created in which the mass analysis data and the optical analysis data for plasma concentrations are stored together for subsequent access. The data gathered is stored using a general purpose programmable controller that includes an I/O interface coupled to the magnet 214 and a mass storage device such as disk drive for the storing the database 185. A combination of computer programs including artificial intelligence software 190 executing on the computer is programed to utilize the data on the database 185 to predict parameters of the plasma based on the observed data. In accordance with one aspect of the invention a computer 195 executing the same artifical intelligence software controls at least one parameter of the ion implantation process of the FIG. 1 system 10 or alternately can be used to control a process such as the process described below in conjunction with FIG. 6.

Figure 7:
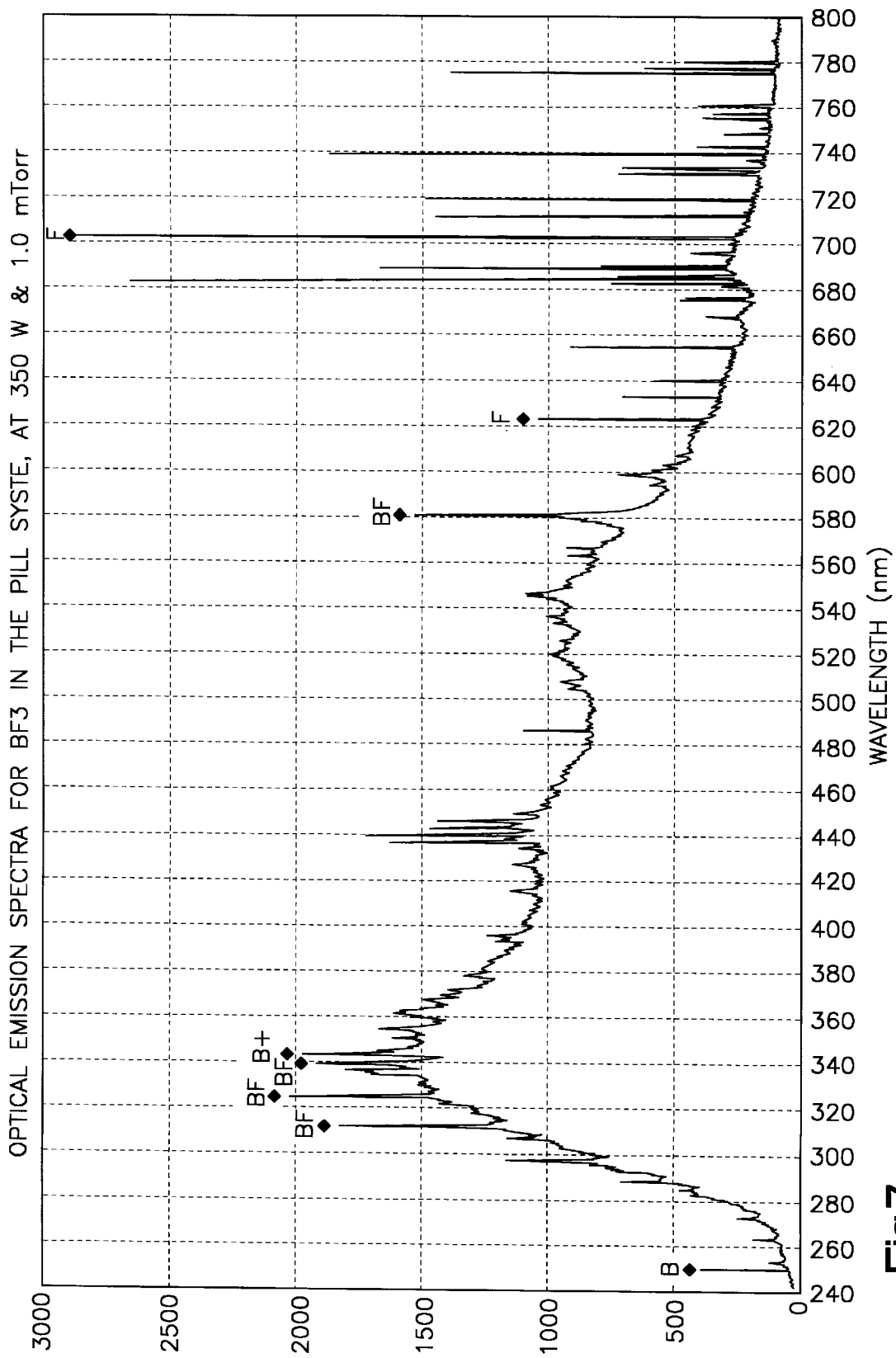
FIG. 7 is a graph showing optical emission spectra intensity as a function of wavelength for different ions and molecules present in an ion source plasma.

Data used in creating the database 185 is depicted in the graph of FIG. 7. FIG. 7 is a graph for an optical emission of $BF_3$ plasma (gas concentration fixed) from the optical spectrometer 270. A number of peaks have been labeled with the constituent particle that produced that peak. These peaks are derived from readily identified wavelength data gathered from optical spectroscopy information tabulated by others. The 311 nmeter peak, for example, is a well known spectral peak for a neutrally charged BF molecule. Note, the data on the graph of FIG. 7 is based on a specific starting gas (boron tri-fluoride) of a specified pressure and specified power input to the plasma. Changing the gas concentration produces a different characteristic curve of constituents and hence the data of FIG. 7 changes. In a preferred data gathering step 170 the pressure is varied and the entire optical analysis over the wavelengths shown in FIG. 7 is stored in the database 185 for each gas pressure and excitation energy. Thus, a series of different data tablulations for different gas pressures and different rf powers is produced from the optical emission and mass spectrum analysis.

Figure 8:
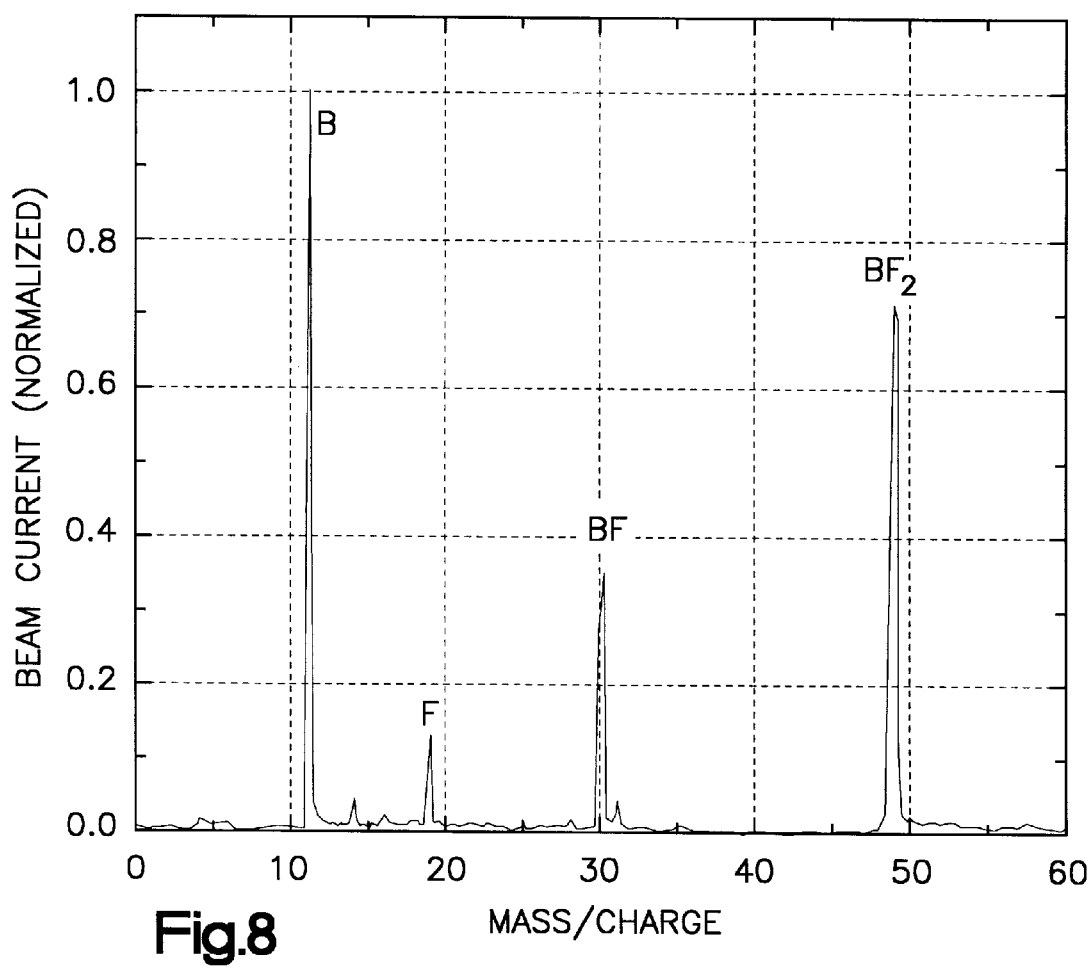
FIG. 8 is a graph showing peaks in atomic mass as a function of intensity for ions emitted from a plasma source.

The entire database is populated by forming a plasma at a certain measureable condition of gas density and then varying the magnetic field strength of the mass analysis magnet for the plasma under consideration. This will allow data such as the data of FIG. 8 to be obtained and stored at the same time the data of FIG. 7 is obtained and stored in the database. To gather additional data the gas pressure of the source material injected into the plasma chamber is adjusted and both the mass analysis and optical sprectrum analysis again performed.

A preferred process of prediction uses learning algorithms associated with artificial intelligence or neural network software. The process involves the comparisons of data points from the optical analysis with optical analysis of the database that has been previously obtained along with the mass data of FIG. 8. By means of a neural network training and the use of the trained algorithm the relative concentrations of the plasma constituents within the source chamber 12 are obtained. A preferred computer program that performs the analysis uses techniques such as back-propagation, simulated annealing or genetic algorithms for the neural network training.

FIGS. 1*a* and 1*b* illustrate a conductive workpiece support 30 of FIG. 1 to which has been added several dosimetry cups 60 for use in practicing the present invention. Although the present discussion is directed to the ion implantation system 10 depicted in FIG. 1, it is well known that dosimetry cups may similarly be added to the ion implantation system depicted in FIG. 6 by disposing them on the spinning workpiece support 225 (not shown in FIG. 6). The cups 60 are placed so that a top plate 66 (shown in FIG. 3) is even with the implantation surface of the workpiece 14. Ions accelerated toward the implantation surface enter an aperture 62 to be measured. The close proximity of the cups 60 to the workpiece 14 causes the amount of ions which enter the cups 60 to be representative of the amount of ions which are implanted in the workpiece. The dosimetry cup 60 provides a measurement of the total current striking the collecting surface of the dosimetry cup (shown as 69 in FIG. 3). This current value is then manipulated by the control unit 195 to determine a charge per square centimeter within the dosimetry cup and correspondingly on the surface of the workpiece 14. The use of four cups 60 spaced around the periphery of the support 30 yields dose data at four different locations.

Figure 3:
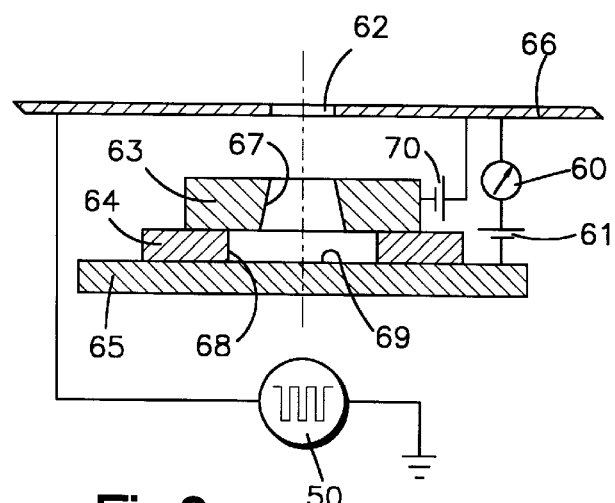
FIG. 3 is a cross sectional view of a dosimetry cup for use with the ion implantation system depicted in FIG. 1.

FIG. 3 is a more detailed depiction of a dosimetry cup 60 shown in cross section. The dosimetry cup has a generally cylindrical shape and includes the top plate 66, a top Faraday electrode 63, an insulator 64, and a bottom Faraday collecting plate 65. Dosimetry cups having other shapes such as sectors (not shown) disposed around the circumference of the implantation surface may also be used. The top plate 66 of the dosimetry cup is located at the same level as the implantation surface of the workpiece 14*a* (not shown in FIG. 3). The top plate 66 is electrically connected to the pulse generator 50 which is used to accelerate ions into the workpiece. Hence, the top plate 66 becomes electrically biased when the workpiece support 30 is biased by the pulse generator, thereby attracting plasma ions from the region 42 into the dosimetry cup 60.

The top Faraday electrode 63 is kept negatively biased relative to the top plate 66 by source 70. An appropriate negative bias is −200 V. The negative potential between the top plate 66 and the top Faraday electrode 63 prevents secondary electrons caused by ions striking the plate 65 from leaving the dosimetry cup 60 and also repels plasma electrons from entering the dosimetry cup 60, both of which may compromise the accuracy of the dosimetry cup measurement. The insulator 64 electrically isolates the top Faraday electrode 63 from the bottom Faraday collecting plate 65.

In this embodiment, the bottom Faraday collecting plate 65 is positively biased to 20 V relative to the top plate 66 by a voltage source 61. This positive bias prevents plasma ions from drifting into the collecting plate 65 in between pulses from pulse generator 50 and causing false registrations of ions by the dosimetry cup 60. When the pulse generator 50 applies a negative pulse to the workpiece support 30 and the top plate 66, the collecting plate 65 also becomes negative, in this embodiment the collecting plate is 20 volts more positive than the negative voltage (typically 20 kilovolts) applied by the pulse generator. Because the collector plate voltage varies only slightly in magnitude from the pulse applied to the workpiece support, plasma ions are attracted to the collecting plate 65 in essentially the same manner and amount as the plasma ions impacting the surface of the workpiece 14, so that an accurate representation of workpiece dosage is obtained.

FIG. 5 is a flowchart showing processing steps performed in accordance with a preferred embodiment of the present invention combining the optical spectroscopy measurements and the dosimetry cup data. The process shown in FIG. 5 describes the present invention for use with the ion implantation system of either FIG. 1 or FIG. 6. At the start of the implantation process, a plasma is created 310. Optical emission spectroscopy data and mass data is gathered 320 for the plasma. In FIG. 6 the OES data is gathered from the spectrometer 270 and in FIG. 1 it is gathered from the spectrometer 175. The mass data is derived from the database that was previously created. Making reference to the database created, at a step 330 the plasma constituency is compared to the treatment process specification. If the plasma constituency is not satisfactory, the gas mixture and/or power input are adjusted accordingly 340. Once the plasma constituency is within acceptable limits, ion implantation is performed 350 on one or more workpieces.

Current from the one or more dosimetry cups is monitored and OES data gathered 360. From this data an implant duration is A predicted 367. Workpiece treatment takes place until a determination is made 370 that the workpiece has reached the desired level of doping based on a time interval determined from the dose signal from the dosimetry cups and the OES data. The workpiece dose is calculated by control unit 195 (shown in FIG. 1). Integrating over the multiple pulses from the modulator yields the total charge and dividing by the area of the opening yields the charge per area or dose. The workpiece dose is continuously compared to the desired dose by control unit 195. Once the dose level is satisfactory for a given wafer, the ion implantation process is suspended while a new wafer is placed into the chamber.

The present invention combines accurate plasma constituency measurements with continuous real time dose measurement to increase doping accuracy in a manufacturing environment. While several alternate embodiments of the present invention have been described with a degree of particularity, it is the intent that the invention include all modifications and alterations from the disclosed design falling within the spirit or scope of the pending claims.

What is claimed is:

1. An ion implantation system for causing ions to impact an implantation surface comprising:

a) a process chamber defining a chamber interior into which one or more workpieces can be inserted for ion treatment;
   b) an energy source for setting up an ion plasma within the process chamber;
   c) an optical sensor for monitoring the ion plasma and for providing optical data;
   d) a data store correlating optical analysis obtained from the optical sensor to constituency of the ion plasma;
   e) a workpiece support for positioning one or more workpieces within an interior region of the process chamber so that an implantation surface of the one or more workpieces is positioned within the ion plasma;
   f) a conducting member which generates an electric field that causes ions from the ion plasma to strike the implantation surface of the workpiece;
   g) a pulse generator in electrical communication with the conducting member for applying electrical pulses to drive ions into the implantation surface of the workpiece;
   h) one or more electrically biased dosimetry cups including an ion collecting surface parallel to the implantation surface biased to prevent ions from drifting into the dosimetry cup during the time between the electrical pulses; and
   i) a computation means for calculating the ion dose profile of the workpiece from dosimetry cup data.

2. The ion implantation system of claim 1 wherein the data store further correlates optical analysis data with mass analysis data.

3. The ion implantation system of claim 1 wherein the computational means is a neural network.

4. The ion implantation system of claim 1 further comprising a control unit in communication with the computation means for controlling an implantation parameter.

5. The ion implantation system of claim 4 wherein the parameter controlled is the duration of the implantation process.

6. The ion implantation system of claim 1 wherein the one or more dosimetry cups include:

a) a negatively biased electrode to repel secondary electrons from the collecting surface and electrons from the plasma; and
   b) a positively biased ion collecting surface to repel plasma ions.

7. The ion implantation system of claim 1 wherein the conducting member is the workpiece support.

* * * * *